(12) United States Patent
Jung et al.

(10) Patent No.: US 12,255,083 B2
(45) Date of Patent: Mar. 18, 2025

(54) SEMICONDUCTOR DIE PICKUP APPARATUS

(71) Applicant: SK hynix Inc., Icheon-si (KR)

(72) Inventors: Jae Yeong Jung, Icheon-si (KR); Jong Kyu Moon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 343 days.

(21) Appl. No.: 17/847,682

(22) Filed: Jun. 23, 2022

(65) Prior Publication Data
US 2023/0230860 A1   Jul. 20, 2023

(30) Foreign Application Priority Data

Jan. 20, 2022 (KR) ........................ 10-2022-0008806

(51) Int. Cl.
*H01L 21/67* (2006.01)
(52) U.S. Cl.
CPC .............................. *H01L 21/67132* (2013.01)
(58) Field of Classification Search
CPC ........... H01L 21/67132; H01L 21/6836; B32B 43/006
See application file for complete search history.

(56) References Cited

U.S. PATENT DOCUMENTS

| | | | |
|---|---|---|---|
| 2008/0227239 A1* | 9/2008 | Shibata | H01L 21/67132 156/765 |
| 2009/0101282 A1* | 4/2009 | Fujino | H01L 21/67132 156/765 |
| 2017/0358468 A1* | 12/2017 | Fukushi | H01L 21/67115 |

FOREIGN PATENT DOCUMENTS

JP   2003224088 A   8/2003

* cited by examiner

*Primary Examiner* — George R Koch
(74) *Attorney, Agent, or Firm* — WILLIAM PARK & ASSOCIATES LTD.

(57) ABSTRACT

A semiconductor die pickup apparatus according to an aspect of the present disclosure includes a tape peeler for peeling a mount tape from a semiconductor die, and a flipper for holding the semiconductor die, wherein the tape peeler includes a housing part having a groove that faces the mount tape, a cover part covering the groove, a roller part connected to the cover part, and a vacuum part performing vacuum suction within the groove. The roller part moves to wind the cover part.

16 Claims, 19 Drawing Sheets

SEMICONDUCTOR DIE PICKUP APPARATUS

CROSS-REFERENCE TO RELATED APPLICATIONS

The present application claims priority under 35 U.S.C 119(a) to Korean Application No. 10-2022-0008806, filed on Jan. 20, 2022, which is incorporated herein by reference in its entirety.

BACKGROUND

1. Technical Field

The present disclosure generally relates to a semiconductor packaging technology and, more particularly, to a semiconductor die pickup apparatus.

2. Related Art

The semiconductor packaging technology is a technology of packaging semiconductor dies to form semiconductor packages. The semiconductor packaging technology may include technical fields, such as dividing semiconductor dies from a wafer that is manufactured through a semiconductor manufacturing process, mounting the divided semiconductor dies on an interconnection structure, such as a printed circuit board (PCB), stacking the semiconductor dies, or the like.

When semiconductor dies are mounted on a printed circuit board (PCB) or stacked over another semiconductor die, the semiconductor dies may be prepared while being attached to a mount tape. In order to handle the semiconductor dies, a process of separating the semiconductor dies from the mount tape may be preferentially performed. The semiconductor dies may be picked up by being peeled off from the mount tape by a the pickup apparatus.

As semiconductor packages in a form capable of implementing high density and high performance are required, the thicknesses of semiconductor dies are becoming thinner. When a semiconductor die is separated from a mounting tape, there is an increasing risk that the semiconductor die is damaged by stress that may be applied to the semiconductor die. Accordingly, there is a need to improve on apparatuses that are capable of separating semiconductor dies from a mounting tape to reduce or prevent damage to the semiconductor dies.

SUMMARY

A semiconductor die pickup apparatus according to an aspect of the present disclosure may include a tape peeler for peeling a mount tape from a semiconductor die, and a flipper for holding the semiconductor die, wherein the tape peeler may include a housing part having a groove that faces the mount tape, a cover part covering the groove, a roller part connected to the cover part, and a vacuum part performing vacuum suction within the groove. The roller part may move to wind the cover part.

DETAILED DESCRIPTION

Figure 1:
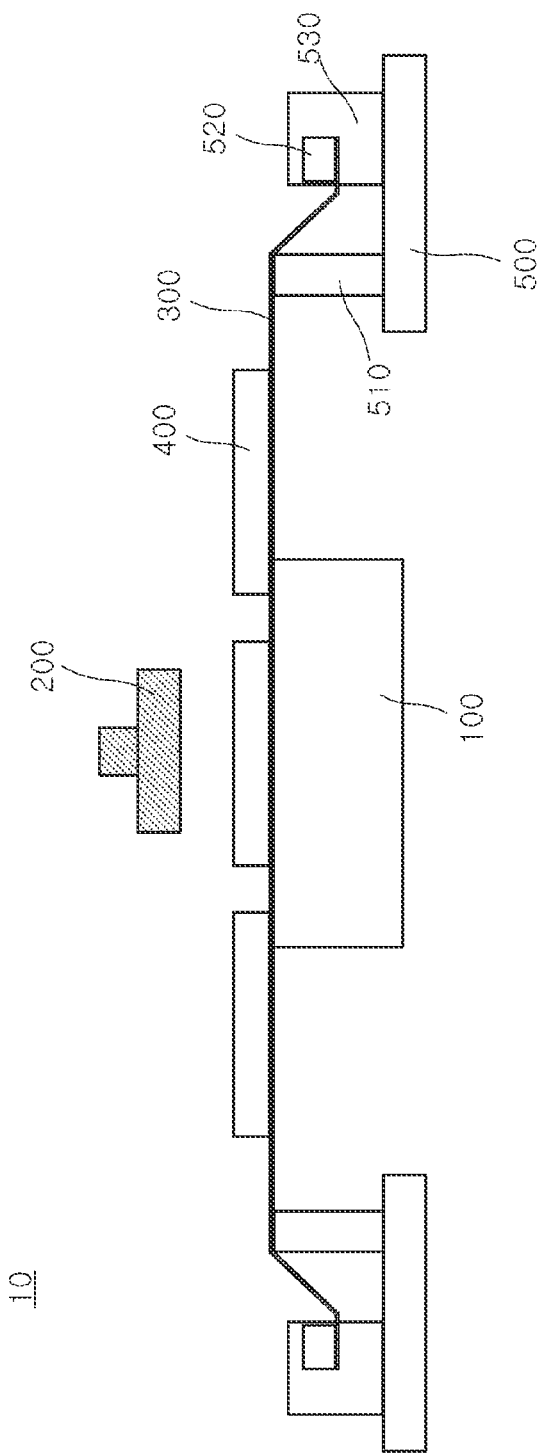
FIG. 1 is a schematic diagram illustrating a semiconductor die pickup apparatus according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first" and "second," "side," "top," and "bottom or lower" may be used herein to describe various devices, these devices should not be limited by these terms. These terms are only used to distinguish one device from another device, but not used to indicate a particular sequence or number of devices.

The semiconductor device may include a semiconductor substrate. A plurality of semiconductor substrates may be stacked and packaged to form a semiconductor package. The semiconductor device may refer to the semiconductor package. The semiconductor substrate may refer to a semiconductor wafer, a semiconductor die, or a semiconductor chip in which electronic components and devices are integrated. The semiconductor chip may refer to a memory chip in which memory integrated circuits, such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processors, such as application processors (Aps), graphic processing units (GPUs), central processing units (CPUs) or system-on-chips (SoCs). The semiconductor device may be employed in information communication systems, such as mobile phones, electronic systems associated with biotechnology or health care, or wearable electronic systems. The semiconductor device may be applicable to internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIG. 1 is a schematic diagram illustrating a semiconductor die pickup apparatus 10 according to an embodiment of the present disclosure.

Referring to FIG. 1, the semiconductor die pickup apparatus 10 may include a tape peeler 100 and a flipper 200. The semiconductor die pickup apparatus 10 may pick up semiconductor die 400 from a mount tape 300. Then, the semiconductor die pickup apparatus 10 may transfer the picked up semiconductor die 400 to another packaging apparatus. The semiconductor die pickup apparatus 10 may further include a supporter 510 and an expander 530. The supporter 510 and the expander 530 may be disposed on a stage 500.

The tape peeler 100 may be disposed inside the stage 500, and the tape peeler 100 may be disposed so that an upper portion of the tape peeler 100 is in contact with a backside of the mount tape 300. The tape peeler 100 may be positioned behind the semiconductor die 400 to be separated from the mount tape 300. The supporter 510 may support the mount tape 300 to which a plurality of semiconductor dies 400 are attached. The supporter 510 may have a ring shape extending along an edge portion of the mount tape 300 and may support an edge inner portion of the mount tape 300. The edge inner portion of the mount tape 300 may be a region to which the semiconductor dies 400 are not attached.

The expander 530 may be disposed on the stage 500. The expander 530 may be apart from the supporter 510. The expander 530 may serve to pull and expand the mount tape 300, A mount frame 520 may be mounted on the mount tape 300. The mount frame 520 may have a ring shape extending along the edge of the mount tape 300. The mount frame 520 may be attached to an edge inner portion of the mount tape 300. The supporter 510 may be disposed to support a portion of the mount tape 300 between the mount frame 520 and the semiconductor die 400. The expander 530 may expand the mount tape 300 by holding the mount frame 520 and lowering the mount frame 520 to a position that is lower than an upper end of the supporter 510. The expander 530 may have a ring shape. In the present embodiment, the supporter 510 and the expander 530 are provided as means for mounting the mount tape 300, to which the plurality of semiconductor dies 400 are attached, to the semiconductor die pickup apparatus 10, but the means for mounting the mounting tape 300 to the semiconductor die pickup apparatus 10 is not limited to the supporter 510 and the expander 530 and may be configured in various ways.

The flipper 200 may be configured as a picker module that holds the semiconductor dies 400. The tape peeler 100 may be configured as a module that peels off the mount tape 300 from the semiconductor dies 400. The tape peeler 100 may separate the semiconductor dies 400 from the mount tape 300.

The flipper 200 may be positioned over the semiconductor die 400 to access the semiconductor die 400 attached to the mount tape 300. The flipper 200 may pick up the semiconductor die 400 that is separated from the mount tape 300 by the tape peeler 100. The flipper 200 may hold the semiconductor die 400 to fix the position of the semiconductor die 400 while the tape peeler 100 peels the mount tape 300 from the semiconductor die 400. After the tape peeler 100 peels the mount tape 300 from the semiconductor die 400, the flipper 200 may vertically raise the semiconductor die 400 and move the semiconductor the 400 to another position.

The semiconductor die pickup apparatus 10 may further include a flipper driver (not shown) configured to be connected to the flipper 200. The flipper driver may move the flipper 200 to a corresponding semiconductor die 400 to be peeled off or may drive the flipper 200 to hold the semiconductor die 400. The flipper 200 may hold the semiconductor die 400 through vacuum suction. A vacuum hole (not shown) may be formed in the flipper 200, and vacuum suction may be performed through the vacuum hole, thereby holding the semiconductor die 400 with a vacuum suction force. A flipper vacuum part (not shown) that applies a vacuum to the flipper 200 may be further configured in the semiconductor die pickup apparatus 10 to be connected to the flipper 200. The present embodiment provides adsorption through vacuum suction as a means for the flipper 200 to hold or pick up the semiconductor die 400, but the flipper 200 is not limited thereto and may be modified in various ways.

The tape peeler 100 may be positioned in such a way that the mount tape 300 is interposed between the tape peeler 100 and the flipper 200. The tape peeler 100 may be moved to be positioned in such a way that the mount tape 300 is interposed between the tape peeler 100 and the semiconductor die 400 to allow for the tape peeler 100 to separate the semiconductor die 400 from the mount tape 300. A tape peeler driver (not shown) that moves the tape peeler 100 may be further configured in the semiconductor die pickup apparatus 10 to be connected to the tape peeler 100 so that the tape peeler 100 may move in a horizontal or vertical direction. The tape peeler 100 may be moved to be in close contact with a portion of the mount tape 300 on which the semiconductor die 400 are attached. The tape peeler 100 may be positioned under the mount tape 300 to overlap the semiconductor die 400 to be separated from the mount tape 300.

Figure 2:
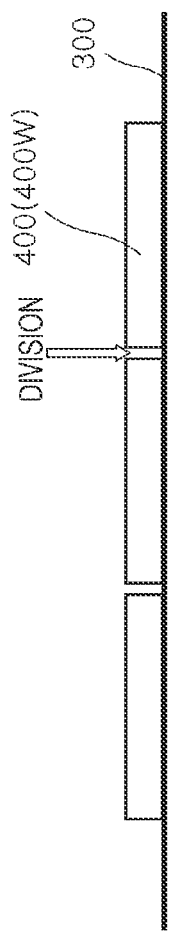
FIGS. 2 to 4 are schematic diagrams illustrating a work piece of the semiconductor die pickup apparatus of FIG. 1.
Figure 3:
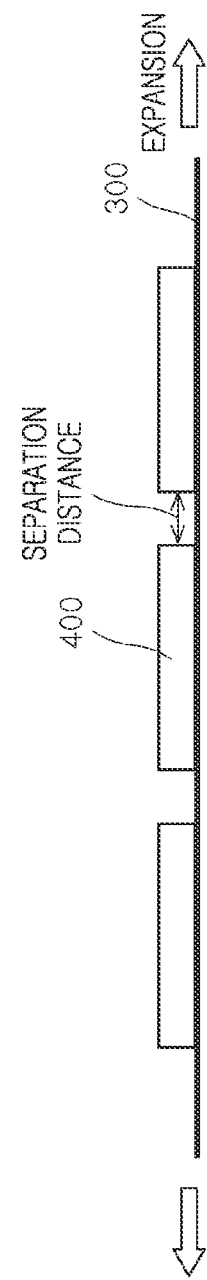
Figure 4:
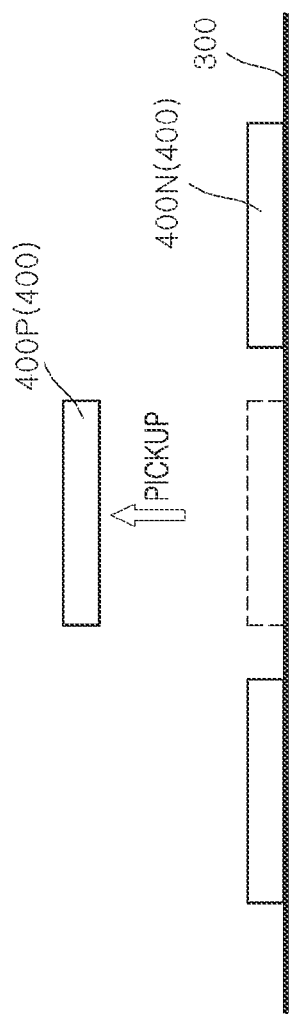

FIGS. 2 to 4 are schematic diagrams illustrating work a piece of the semiconductor die pickup apparatus 10 of FIG. 1.

Referring to FIG. 2, together with FIG. 1, the work piece of the semiconductor pick up apparatus 10 may be the mount tape 300 on which the semiconductor dies 400 are attached. The semiconductor dies 400 may be attached to the mount tape 300 while being sawed or divided from a wafer 400W. The mount tape 300 may be a die attach film (DAF) that is attached to the wafer 400W in a process of dividing the semiconductor dies 400 from the wafer 400W. The mount tape 300 might not be limited to the die attach film and may be understood as a film member or an adhesive member to which the semiconductor dies 400 are attached.

Referring to FIG. 3, together with FIG. 1, the mount tape 300 to which the semiconductor dies 400 are attached may be mounted on the semiconductor die pickup apparatus 10 and may be supported by the supporter 510 of the semiconductor the pickup apparatus 10. When the expander 530 holds and lowers the mount frame 520, the mount tape 300 may be pulled outward from the mount tape 300 by the descent of the expander 530, thereby expanding the mount tape 300. As the mount tape 300 is expanded, a separation distance between the semiconductor dies 400 attached to the mount tape 300 may be increased. Accordingly, as shown in FIG. 4, when a specific semiconductor die 400P is separated and picked up from the mount tape 300, it is possible to reduce the adverse influence on the neighboring semiconductor dies 400N during the separation and pickup operations.

Figure 5:
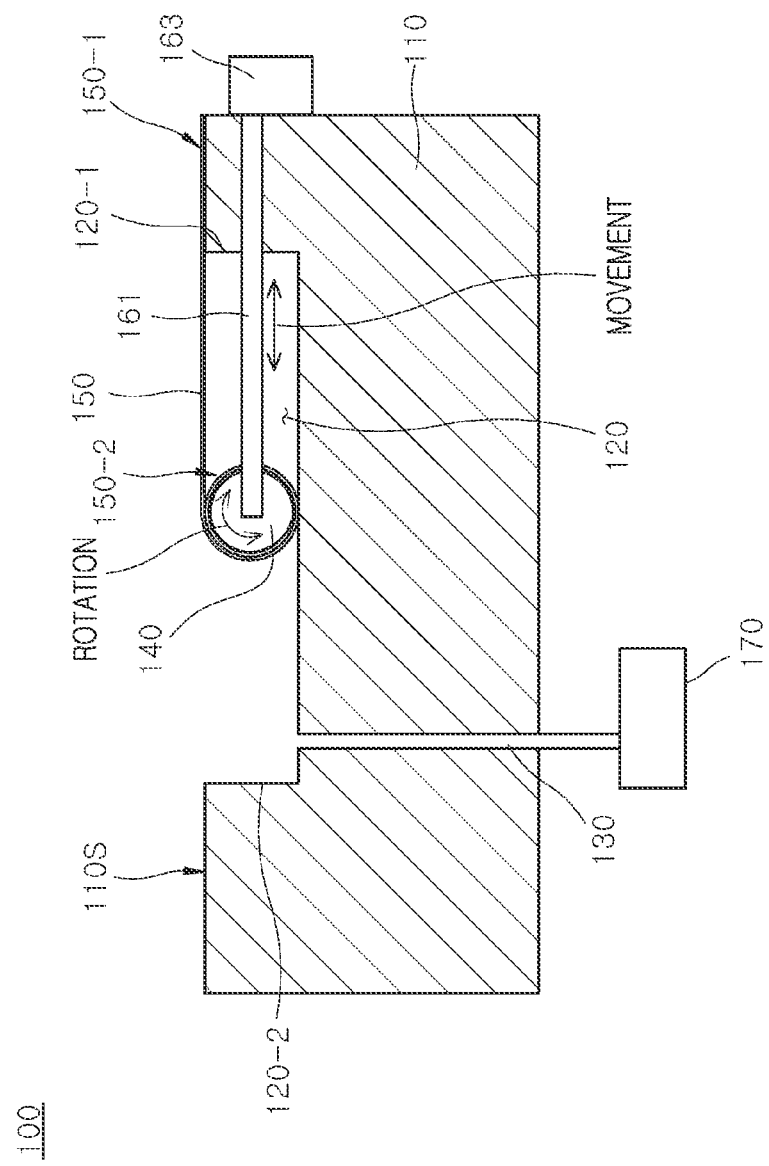
FIG. 5 is a schematic diagram illustrating a tape peeler of the semiconductor die pickup apparatus of FIG. 1.

FIG. 5 is a schematic diagram illustrating the tape peeler 100 of the semiconductor die pickup apparatus 10 of FIG. 1.

Referring to FIG. 5, together with FIG. 1, the tape peeler 100 of the semiconductor die pick up apparatus 10 may be configured to perform an operation of peeling off a portion of the mount tape 300 from the semiconductor die 400. The tape peeler 100 may include a housing part 110 having a concave groove 120, a roller part 140, a cover part 150, and a vacuum part 170. The housing part 110 may constitute a body of the tape peeler 100.

The concave groove 120 may be formed on an upper surface 110S of the housing part 110. The upper surface 110S of the housing part 110 may be a surface that may be in close contact with the mount tape 300. The concave groove 120 of the housing part 100 may be formed to have an open inlet toward the mount tape 300 that is mounted in the semiconductor die pickup apparatus 10. The roller part 140 may be disposed in the concave groove 120 of the housing part 110.

The roper part 140 may be configured to be moved in the concave groove 120 of the housing part 110 and may be configured to be rotated in a first rotational direction or a second rotational direction, the second rotational direction being opposite to the first rotational direction, while being moved. The concave groove 120 of the housing part 110 may have a first side surface 120-1 and a second side surface 120-2 on opposite sides of the concave groove 120 that face each other, and the first side surface 120-1 and the second side surface 120-2 may define the shape of the concave groove 120 by being connected to each other through other side surfaces. The roller part 140 may be configured to move in a first direction or a second direction, the second direction being opposite to the first direction, within the concave groove 120. A roller driver 163 for driving the rotation and movement of the roller part 140 may be further included in the tape peeler 100. The roller driver 163 may be configured to be coupled to the housing part 110, and a driving shaft 161 that connects the roller driver 163 to the roller part 140 may be further connected to the roller part 140.

The cover part 150 may be a member that blocks and closes the concave groove 120 of the housing part 110. The cover part 150 may be a film or a film-shaped member including a cover part first end 150-1 and a cover part second end 150-2, the cover part second end 150-2 being on the opposite end in relation to the cover part first end 150-1. The cover part first end 150-1 may be connected to the housing part 110, and the cover part second end 150-2 may be connected to the roller part 140. The cover part first end 150-1 may be connected to a portion of the upper surface 110S of the housing part 110 that extends to the first side surface 120-1 of the concave groove 120.

As the roller part 140 rotates and moves, the cover part 150 may be wound around the roller part 140 by rotating the roller part 140 or, conversely, may be released by rotating the roller part 140 in the opposite direction. The cover part 150 may include a film made of a flexible material having rollable characteristics or flexibility to be wound around the roller part 140. The cover part 150 may be made of a polymer material or a metal material having flexibility or rollable characteristics.

The vacuum part 170 may be configured with a device capable of forming a vacuum state or inducing a vacuum state, such as a vacuum pump. The vacuum part 170 may vacuum the concave groove 120 to induce a vacuum state in the concave groove 120 of the housing part 110. A vacuum pipe 130 or a vacuum hole that connects the concave groove 120 to the vacuum part 170 may be coupled to or formed in the housing part 110 so that the vacuum part 170 vacuums the concave groove 120.

Figure 6:
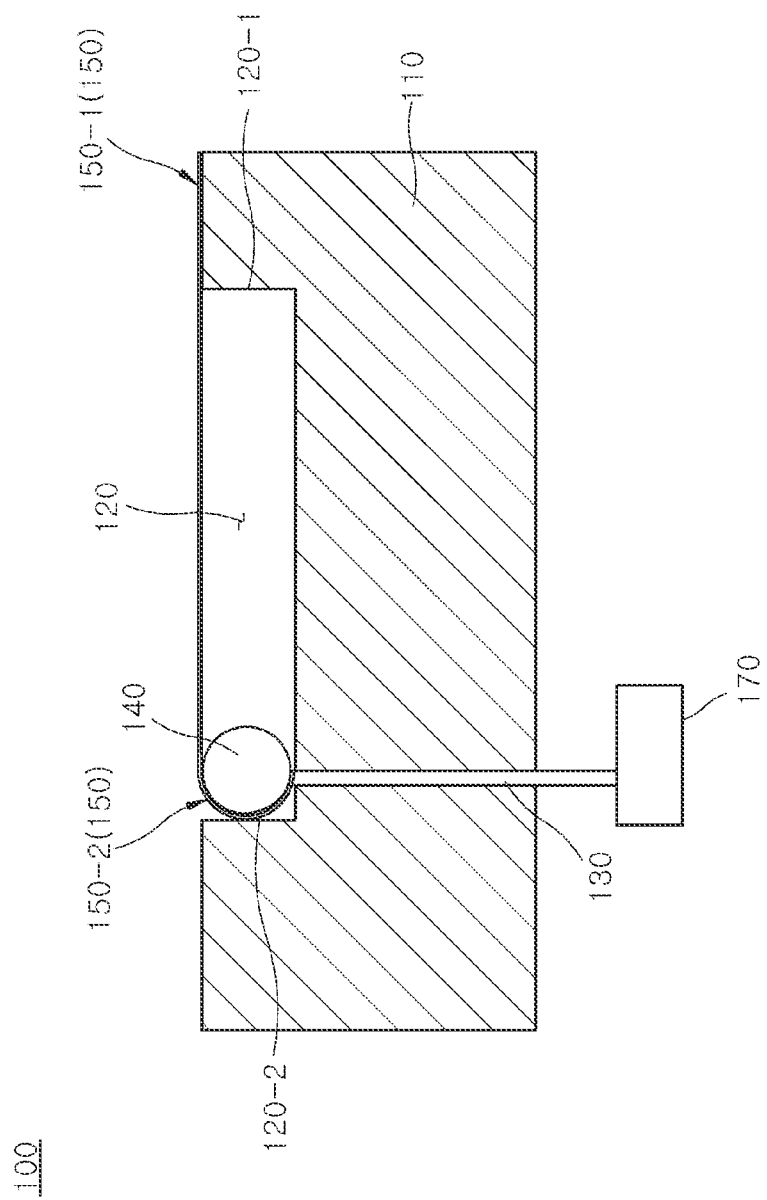
FIGS. 6 to 8 are schematic diagrams illustrating operations of a roller part and a cover part of the tape peeler of the semiconductor die pickup apparatus of FIG. 5.
Figure 7:
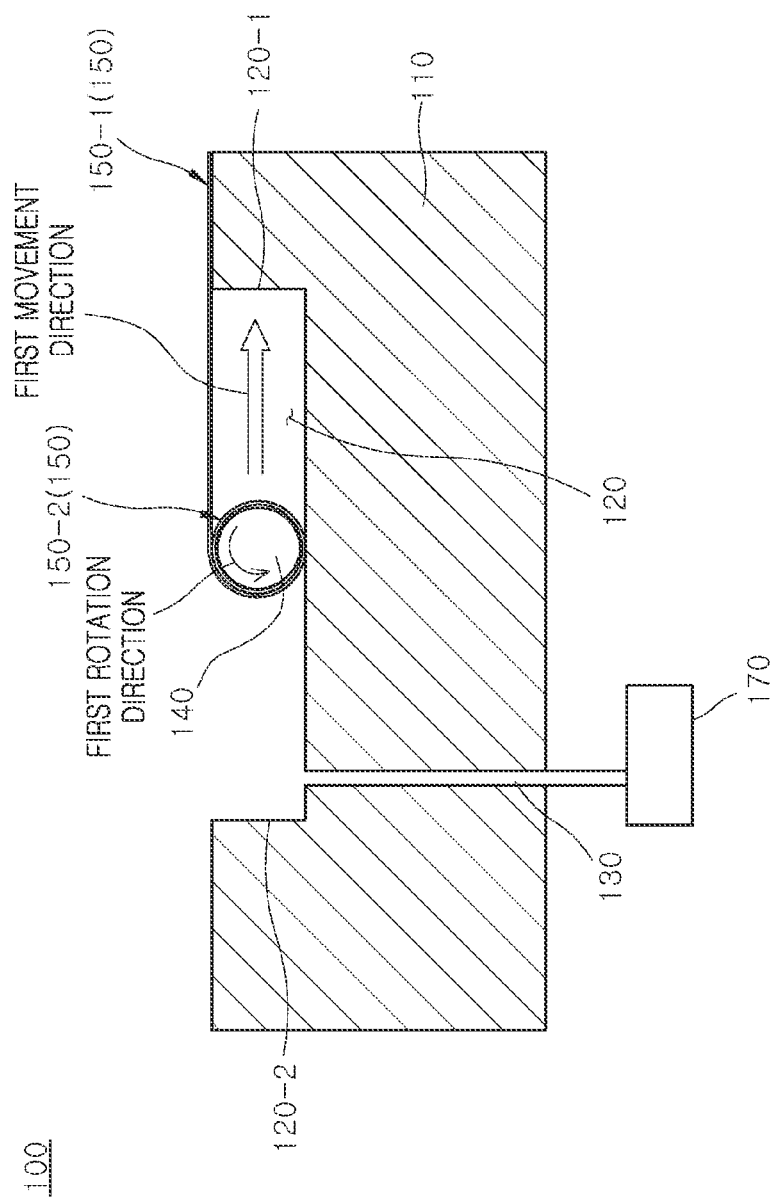
Figure 8:
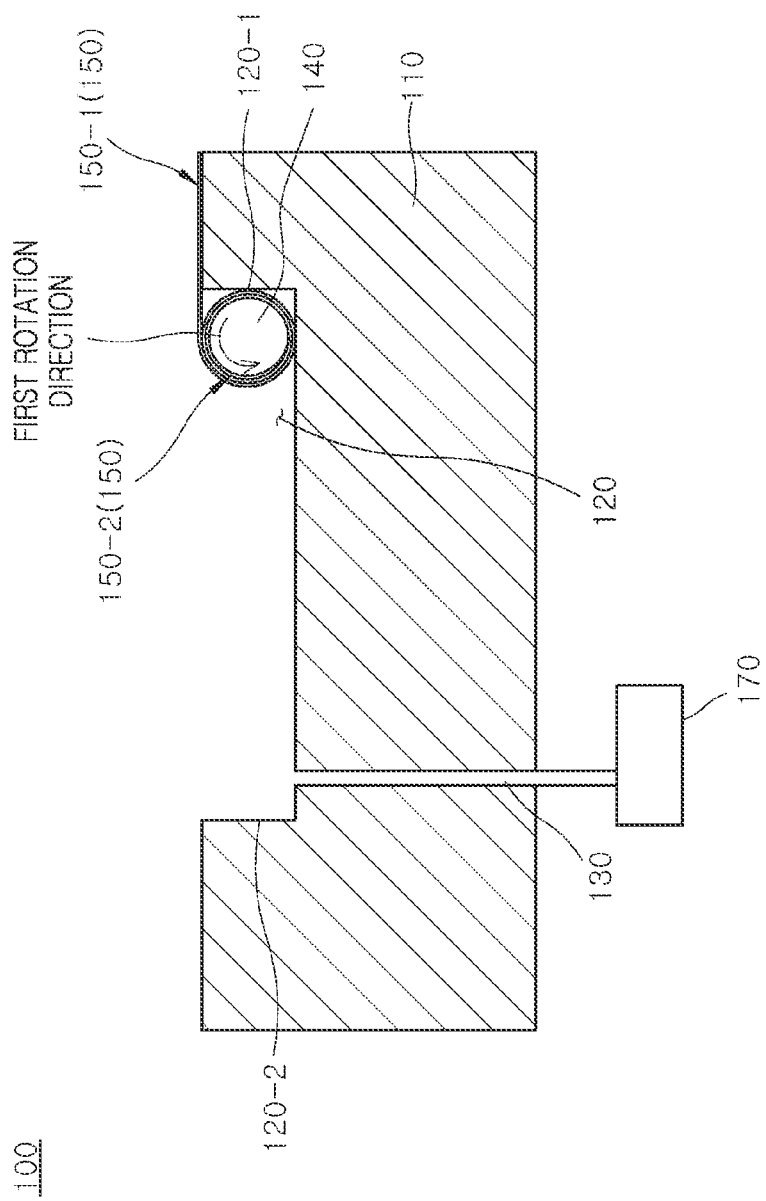

FIGS. 6 to 8 are schematic diagrams illustrating operations of the roller part 140 and the cover part 150 of the tape peeler 100 of the semiconductor die pickup apparatus 10 of FIG. 5.

Referring to FIG. 6, the roper part 140 of the tape peeler 100 of the semiconductor die pickup apparatus 10 may move to a position that is adjacent to the second side surface 120-2 of the concave groove 120 of the housing part 110. Accordingly, the cover part 150 may be released from the roller part 140 to close the concave groove 120. Since the cover part first end 150-1 is connected to the housing part 110 and the cover part second end 150-2 is connected to the roller part 140, when the roller part 140 is moved to be adjacent to the second side surface 120-2 of the concave groove 120, the cover part 150 may be released from the roller part 140 to close the concave groove 120. The roller part 140 may be moved so that the cover part first end 150-1 is in close contact with the second side surface 120-2 of the concave groove 120. Accordingly, the cover part 150 may seal the concave groove 12.

Referring to FIG. 7, as the roller part 140 moves in the first direction with rotating in the first rotational direction, a portion of the cover part 150 may be wound around the roller part 140.

The roller part 140 may move toward the cover part first end 150-1 while winding the cover part 150. Accordingly, the concave groove 120 of the housing part 110 may be sequentially opened from the cover part second end 150-2, a position that is opposite to the cover part first end 150-1, toward the cover part first end 150-1. The first direction of the roller part 140 may be a direction toward the first side surface 120-1 of the concave groove 120. The first rotational direction of the roller part 140 may be a rotational direction in which the cover part 150 is wound around the roller part 140. For example, according to an embodiment, the first rotational direction may be counterclockwise. When the roller part 140 rotates while moving toward the first side surface 120-1 of the concave groove 120, the cover part 150 may be wound around the roller part 140 and the concave groove 120 may be opened sequentially or gradually from the second side surface 120-2.

Referring to FIG. 8, the roller part 140 may move toward the first side surface 120-1 of the concave groove 120 while continuing to rotate in the first rotational direction, so that the cover part 150 may substantially completely open the concave groove 120. As the roller part 140 moves so that the cover part 150 that is wound around the roller part 140 comes into contact with the first side surface 120-1 of the concave groove 120, the concave groove 120 may be opened as much as possible.

Conversely, when the roller part 140 rotates in a second rotational direction, a direction that is opposite to the first rotational direction, i.e., clockwise, and moves in a second direction toward the first side surface 120-1 of the concave groove 120, a portion of the cover part 150 that is wound around the roller part 140 may be released from the roller part 140, and the cover part 150 may dose the concave groove 120 again. In this way, by rotating the roller part 140 while moving within the concave groove 120, the concave groove 120 may be opened or dosed sequentially or gradually depending on the degree to which the cover part 150 is wound around the roller part 140.

FIGS. 9 to 12 are schematic plan diagrams illustrating an operation of the cover part 150 of the tape peeler 100 of the semiconductor die pickup apparatus 10 of FIG. 5.

Figure 9:
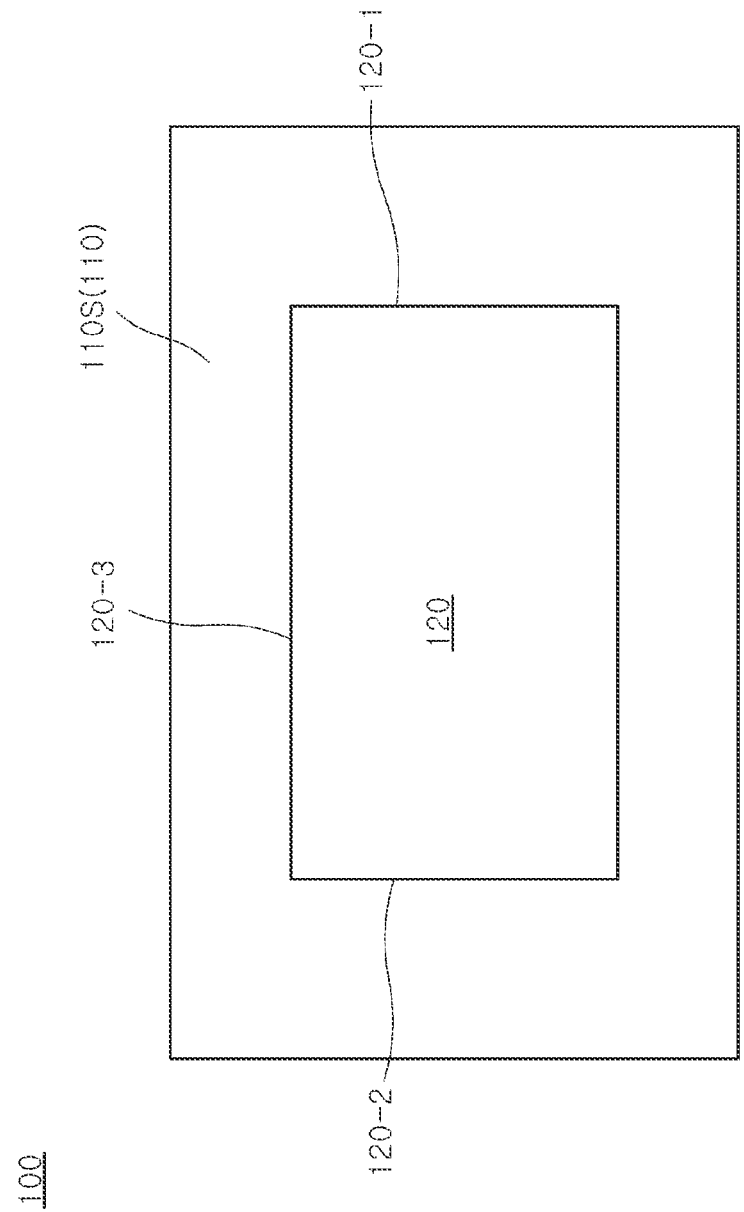
FIGS. 9 to 12 are schematic plan diagrams illustrating an operation of the cover part of the tape peeler of the semiconductor die pickup apparatus of FIG. 5, FIGS. 13 to 18 are schematic diagrams illustrating an operation of the tape peeler of the semiconductor die pickup apparatus of FIG. 1.

Referring to FIG. 9, together with FIG. 5, the concave groove 120 may be formed on the upper surface 110S of the housing part 110 of the tape peeler 100 of the semiconductor die pickup apparatus 10. The concave groove 120 may have a rectangular groove shape when viewed in a plan view. The concave groove 120 of the housing part 110 may have the first side surface 120-1 and the second side surface 120-2, the second side surface 120-2 being on the opposite end in relation to the first side surface 120-1. Furthermore, the first side surface 120-1 and the second side surface 120-2 may form a rectangular shape in a plan view while being connected to each other through another third side surface 120-3.

Figure 10:
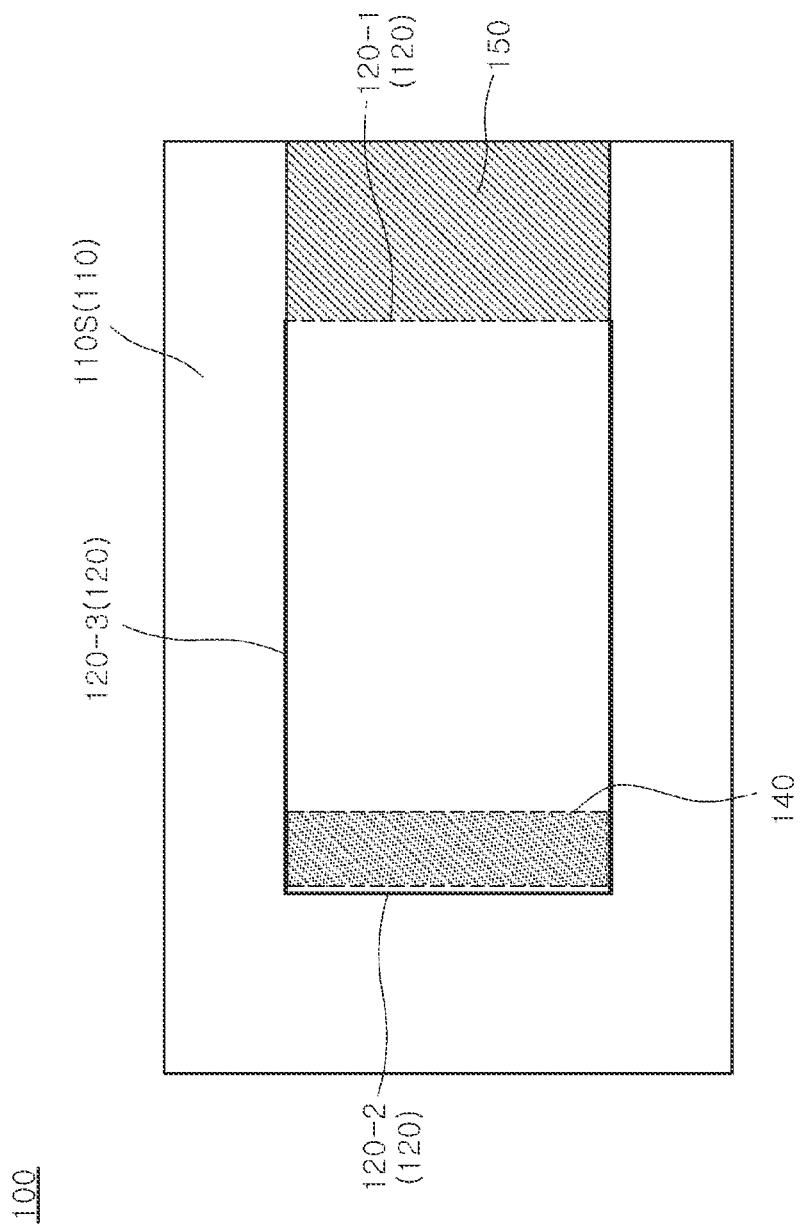

Referring to FIG. 10, together with FIG. 6, the cover part 150 of the tape peeler 100 of the semiconductor die pickup apparatus 10 may be a member that blocks and closes the concave groove 120 of the housing part 110. The cover part 150 may include the cover part first end 150-1 and the cover part second end 150-2, the cover part second end 150-2 being on the opposite end in relation to the cover part first end 150-1, the cover part first end 150-1 may be connected to the housing part 110, and the cover part second end 150-2 may be connected to the roller part 140. The cover part first end 150-1 may be connected to a portion of the upper surface 1105 of the housing part 110, connected to the first side surface 120-1 of the concave groove 120.

Figure 11:
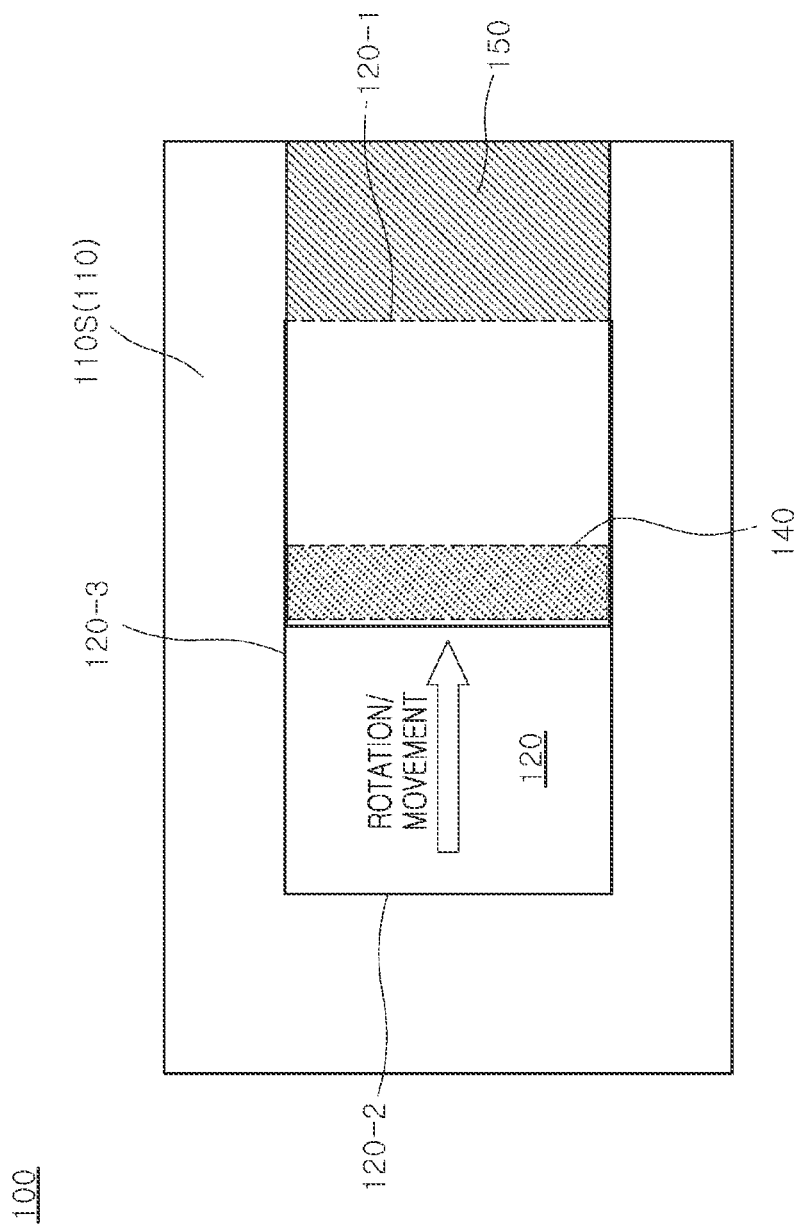

Referring to FIG. 11, together with FIG. 7, as the roller part 140 of the tape peeler 100 of the semiconductor die pickup apparatus 10 moves toward the first side surface 120-1 of the concave groove 120, the roller part 140 may rotate, and a portion of the cover part 150 may be wound around the roller part 140. Accordingly, a portion of the concave groove 120 that is adjacent to the second side surface 120-2 of the concave groove 120 of the housing part 110 may be opened.

Figure 12:
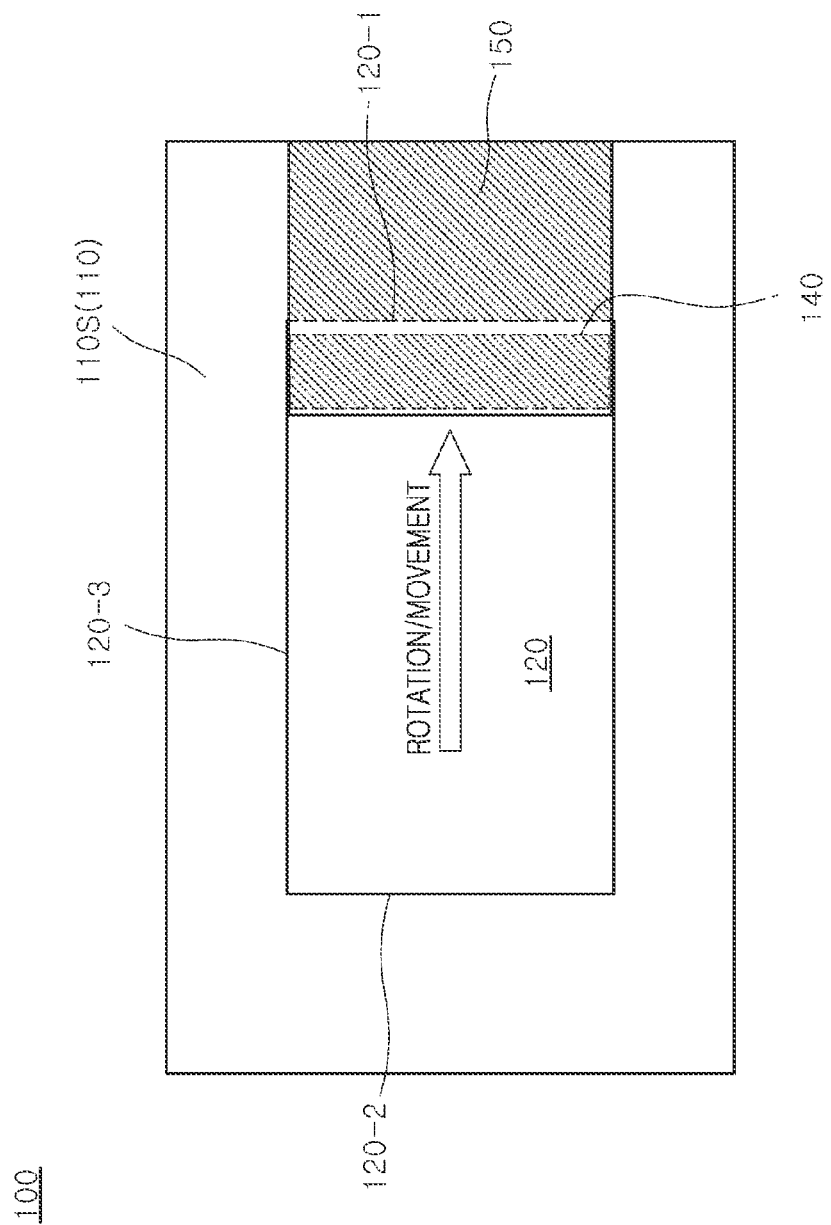

Referring to FIG. 12, together with FIG. 8, when the roller part 140 of the tape peeler 100 of the semiconductor die pick up apparatus 10 moves toward the first side surface 120-1 of the concave groove 120 to substantially contact the first side surface 120-1, the cover part 150 may be wound around the roller part 140 as much as possible due to rotation of the roller part 140. Accordingly, the concave groove 120 of the housing part 110 may be opened as much as possible. As the roller part 140 rotates and moves again toward the second side surface 120-2 of the concave groove 120, the portion of the cover part 150 wound around the roller part 140 may be released from the roller part 140 and the cover part 150 may close the concave groove 120 gradually or sequentially.

FIGS. 13 to 18 are schematic diagrams illustrating operations of the tape peeler 100 of the semiconductor die pickup apparatus 10 of FIG. 1.

Figure 13:
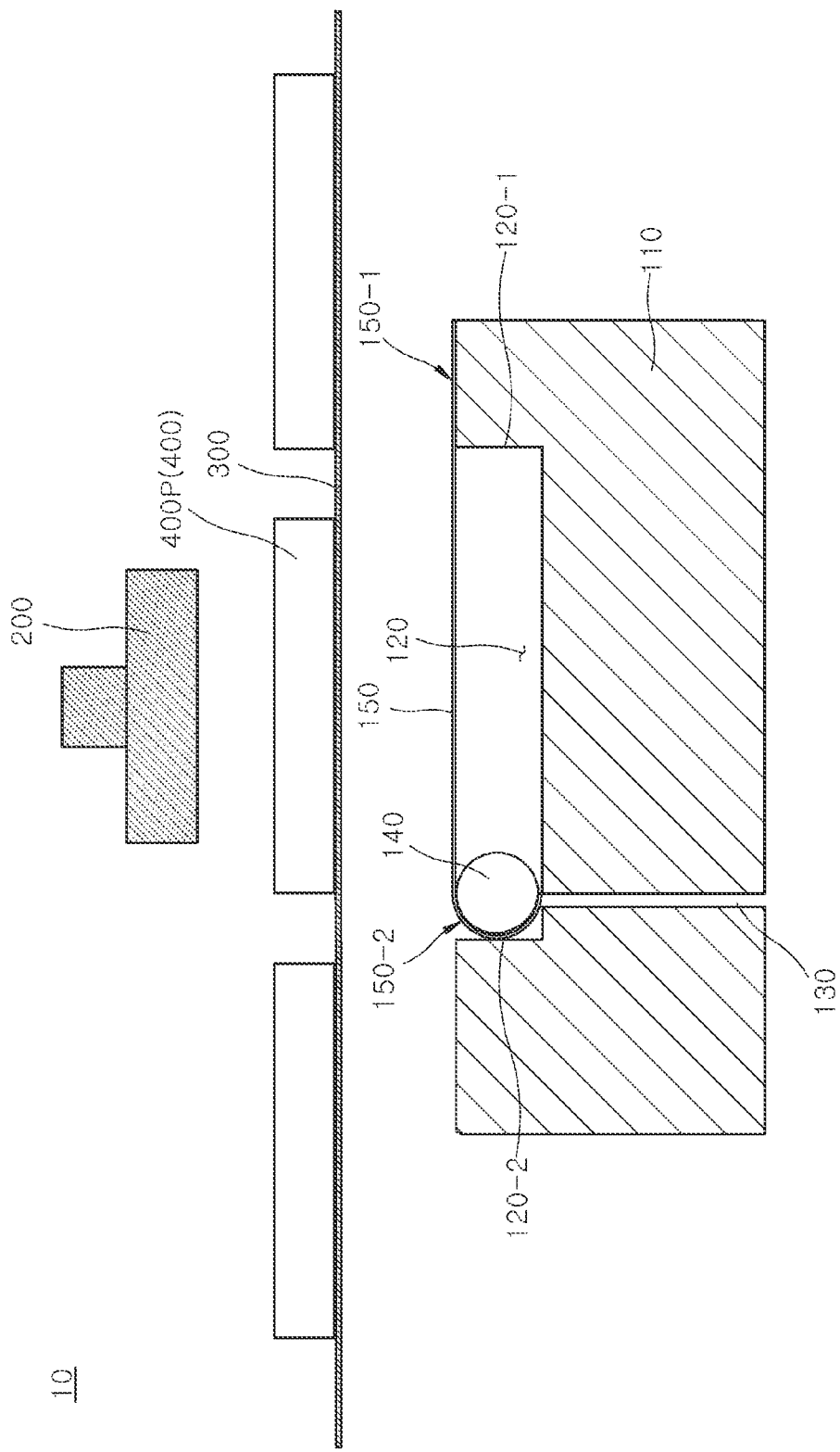
Figure 14:
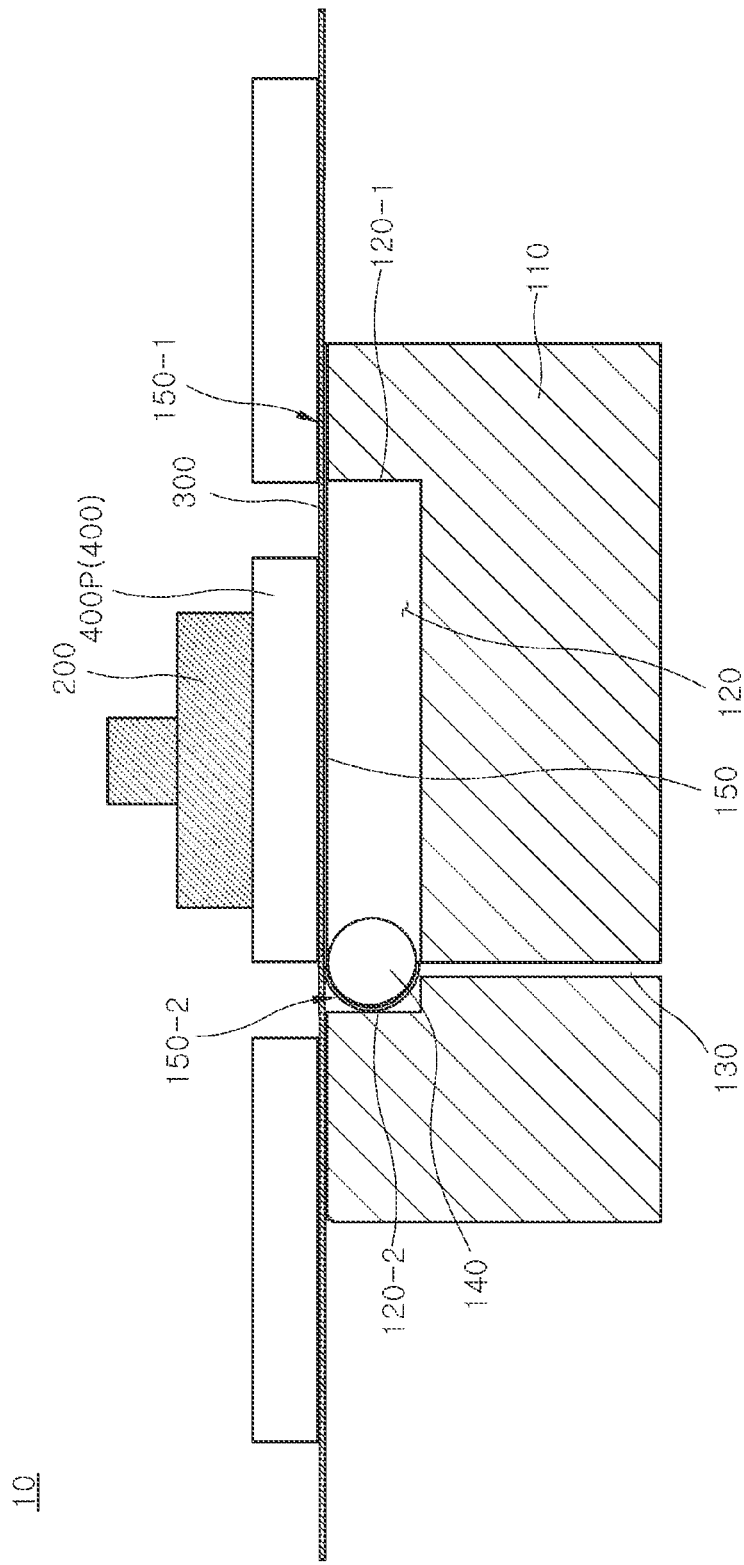

Referring to FIGS. 13 and 14, together with FIG. 1, as the roller part 140 of the tape peeler 100 is positioned at the second side surface 120-2 of the concave groove 120 of the housing part 110, the cover part 150 may be released from the roller part 140 to close the concave groove 120. The mount tape 300 on which the semiconductor dies 400 are attached may be mounted on the semiconductor die pickup apparatus 10.

The tape peeler 100 may be positioned behind the semiconductor die 400P to be separated from the mount tape 300, and the mount tape 300 may be in close contact with the upper surface 1105 of the housing part 110 of the tape peeler 100. The housing part 110 may contact the mount tape 300 so that the semiconductor die 400P to be separated may be overlapped with the concave groove 120. The concave groove 120 of the housing part 110 may have a wider width than the semiconductor die 400P to be separated. The tape peeler 100 may be in close contact with the mount tape 300 so that the first side surface 120-1 and the second side surface 120-2 of the concave groove 120 are positioned outside the semiconductor die 400P to be separated. As shown in FIG. 14, the flipper 200 may hold and fix the semiconductor die 400P to be separated by the vacuum suction.

Figure 15:
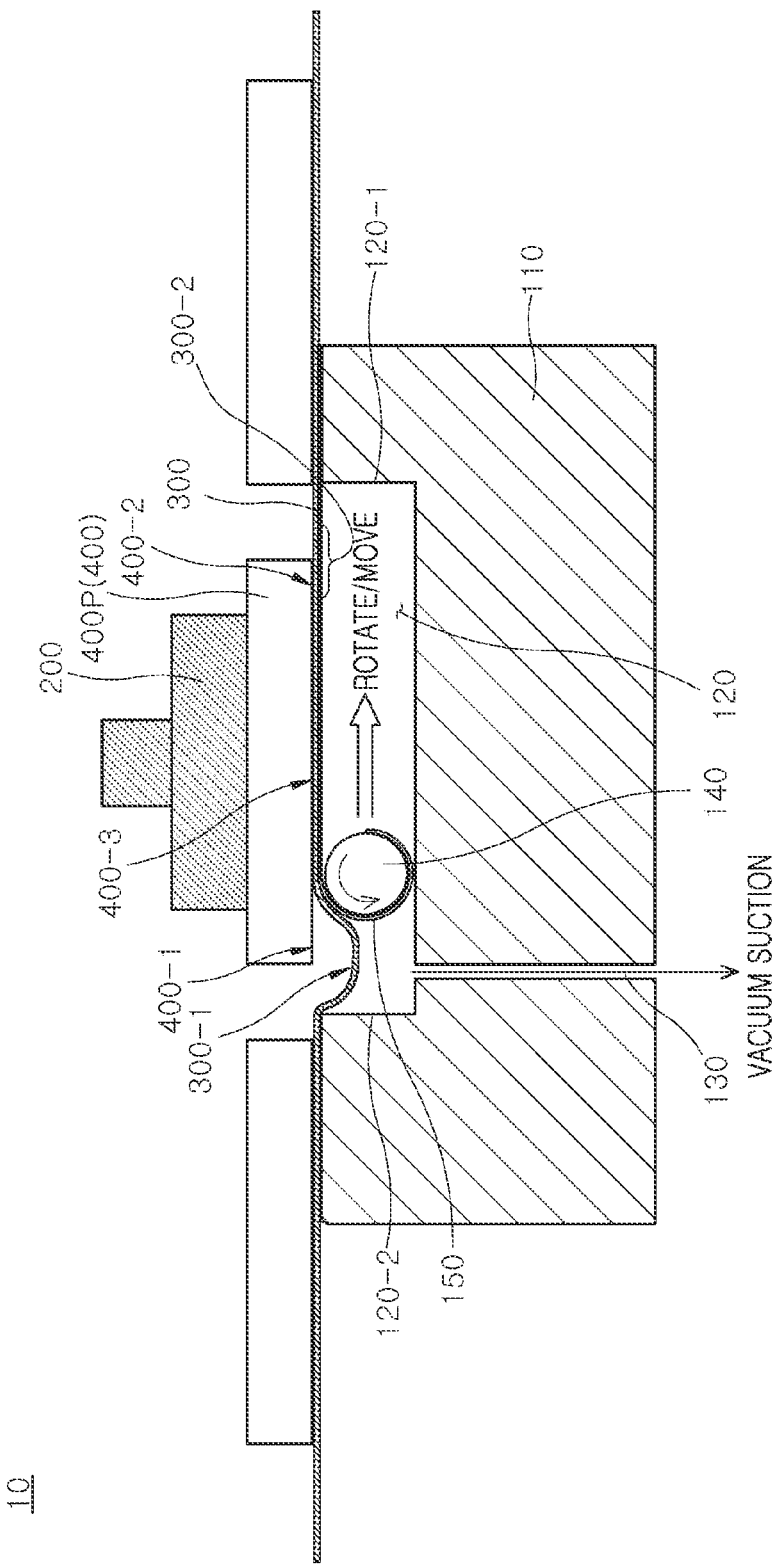

Referring to FIG. 15, when the roller part 140 rotates and moves toward the first side surface 120-1 of the concave groove 120 of the housing part 110, a portion of the cover part 150 may be wound around the roller part 140, and a portion that is adjacent to the second side surface 120-2 of the concave groove 120 may be opened. A first portion 300-1 of the mount tape 300 may be exposed through the open portion of the concave groove 120. When the vacuum part (170 of FIG. 5) vacuums the concave groove 120, a pressure may be applied to the first portion 300-1 of the mount tape 300 through the vacuum suction. Specifically, the portion of the mount tape 300 that is exposed to the open portion of the concave groove 120 may experience the pressure of the vacuum part 170. The first portion 300-1 of the mount tape 300 may be exposed to a vacuum state that is applied to the concave groove 120, and the first portion 300-1 of the mount tape 300 may be pulled into the concave groove 120 based on the pressure difference between the inside of the concave groove 120 and the external air over the mount tape 300.

Although the first portion 300-1 of the mount tape 300 is pulled into the concave groove 120 through the vacuum suction, the semiconductor die 400P to be separated may be held by the flipper 200 and may be maintained in a fixed state without moving from its original position. As such, by the force pulling the first portion 300-1 of the mount tape 300 through the vacuum suction, the first portion 300-1 of the mount tape 300 may be peeled off and separated from the semiconductor die 400P. Because the roller part 140 moves from the second side surface 120-2 of the concave groove 120 toward the first side surface 120-1 and the cover part 150 opens the concave groove 120 from the second side surface 120-2 of the concave groove 120 toward the first side surface 120-1, the first portion 300-1 of the mount tape 300 or the mount tape 300 may be sequentially peeled off and separated, the peeling off beginning from a first edge portion 400-1 of the semiconductor die 400P and ending at a second edge portion 400-2 that is on the opposite end in relation to the first edge portion 400-1.

In this manner, because the mount tape 300 may be peeled off from the first edge portion 400-1 to the second edge portion 400-2 of the semiconductor die 400P, a stress that may be caused to the semiconductor die 400P by peeling the mount tape 300 may be significantly limited or reduced. Accordingly, when the semiconductor die 400P is separated from the mount tape 300, breakage or damage of the semiconductor die 400P due to excessive stress applied to the semiconductor die 400P may be reduced.

The semiconductor die 400P to be separated may include the first edge portion 400-1 and second edge portion 400-2, the second edge portion 400-2 being on the opposite end in relation to the first edge portion 400-1. Furthermore the tape peeler 100 may be positioned with respect to the mount tape 300 to which the semiconductor die 400P is attached so that the first edge portion 400-1 of the semiconductor die 400P that is positioned on the tape peeler 100 to overlap with the concave groove 120 is positioned closer to the second side surface 120-2 of the concave groove 120 than the first side surface 120-1 of the concave groove 120, and the second edge portion 400-2 is positioned closer to the first side surface 120-1 of the concave groove 120 than the second side surface 120-2 of the concave groove 120.

The mount tape 300 may include the first portion 300-1 and the second portion 300-2. The first portion 300-1 of the mount tape 300 may be a portion of the mount tape 300 that overlaps with the first edge portion 400-1 of the semiconductor die 400P to be separated or is adjacent to the first edge portion 400-1. The second portion 300-2 of the mount tape 300 may be another portion of the mount tape 300 that overlaps with the second edge portion 400-2 of the semiconductor die 400P to be separated or is adjacent to the second edge portion 400-2. As the concave groove 120 is gradually and sequentially opened from the second side surface 120-2 toward the first side surface 120-1 based on the movement of the roller part 140 of the tape peeler 100, the first portion 300-1 of the mount tape 300 may be peeled off earlier than the second portion 300-2 of the mount tape 300 by the vacuum suction.

Figure 16:
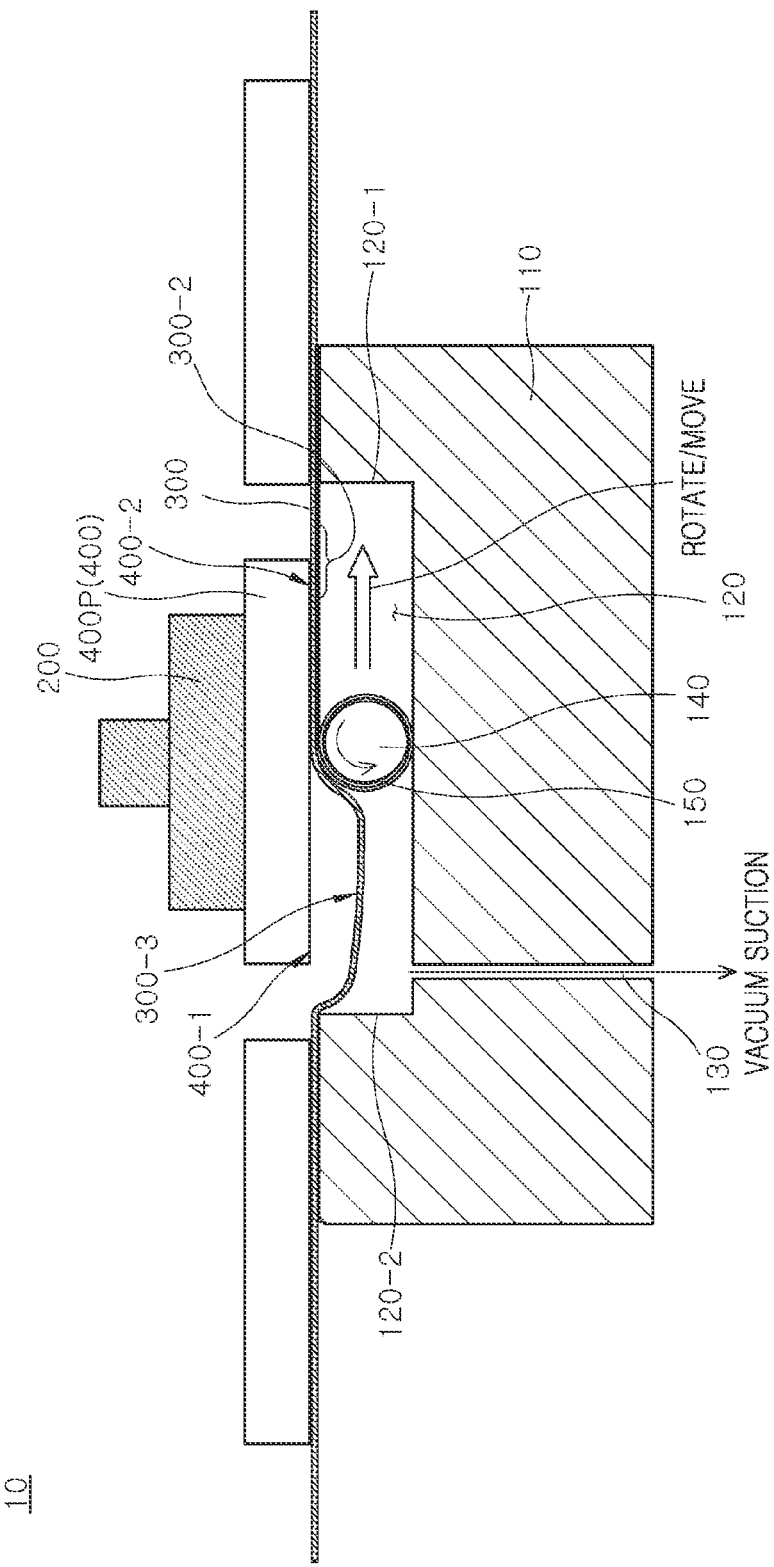

Referring to FIG. 16, when the roller part 140 rotates and further moves toward the first side surface 120-1 of the concave groove 120 of the housing part 110, a portion of the cover part 150 may be further wound around the roller part 140, and the opened portion of the concave groove 120 may be further expanded. Accordingly, more portions 300-3 of the mount tape 300 may be peeled off and separated from the semiconductor die 400P. That is, the degree to which the mount tape 300 is separated from the semiconductor die 400P may increase as the roller part 140 moves from the second side surface 120-2 toward the first side surface 120-1 of the concave groove 120. While the roller part 140 rotates and moves toward the first side surface 120-1 of the concave groove 120 of the housing part 110 and vacuum suction is performed in the concave groove 120, the flipper 200 may hold the semiconductor die 400P so that the semiconductor die 400P does not move and maintains a fixed position.

Figure 17:
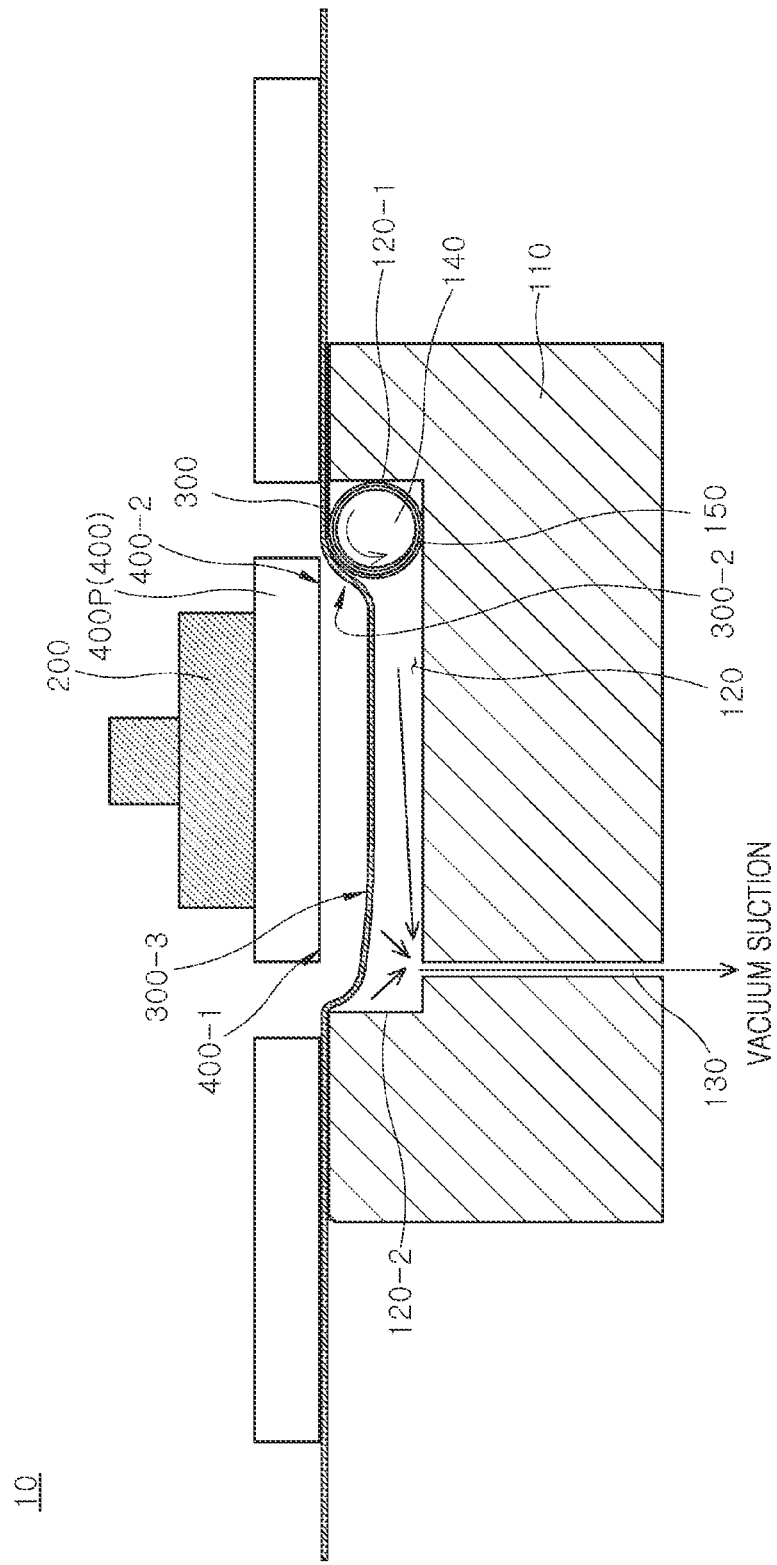

Referring to FIG. 17, when the roller part 140 rotates and further moves toward the first side surface 120-1 of the concave groove 120 of the housing part 110, a portion of the cover part 150 may be further wound around the roller part 140, and the open portion of the concave groove 120 may be further expanded. The open portion of the concave groove 120 may deviate from the overlapping region of the semiconductor die 400P to be separated. Accordingly, more portions 300-3 of the mount tape 300 may be peeled off and separated from the semiconductor the 400P, and the second portion 300-2 of the mount tape 300 that overlaps with the second edge portion 400-2 of the semiconductor die 400P may also be separated from the semiconductor die 400P. Accordingly, the mount tape 300 may be completely separated from the semiconductor die 400P.

The roller part 140 may move toward the first side surface 120-1 of the concave groove 120 so that the mount tape 300 is completely separated from the semiconductor die 400P, Accordingly, the cover part 150 may open all regions of the concave groove 120 that overlaps with the semiconductor die 400P. Accordingly, all regions of the mount tape 300 that overlaps with the semiconductor die 400P may be vacuum-absorbed, and thus, the mount tape 300 may be completely separated from the semiconductor die 400P. The roller part 140 may move toward the first side surface 120-1 of the concave groove 120 so that the cover part 150 and the second portion 300-2 of the mount tape 300 are separated from each other, and the second portion 300-2 of the mount tape 300 is exposed to the concave groove 120. In this manner, the mount tape 300 may be substantially completely separated from the semiconductor die 400P, thereby effectively reducing the phenomenon in which the mount tape 300 is not peeled off.

The roller part 140 may still be positioned in the concave groove 120 even in a state of moving as far as possible toward the first side surface 120-1 of the concave groove 120 so that the mount tape 300 is completely separated from the semiconductor die 400P. Because the concave groove 120 overlaps with the semiconductor die 400P to be separated and does not extend below other neighboring semiconductor dies, it is possible to effectively reduce the adverse influence on the neighboring semiconductor dies during separating the semiconductor die 400P.

While the roller part 140 rotates and moves toward the first side surface 120-1 of the concave groove 120 of the housing part 110 and vacuum suction is performed in the concave groove 120, the flipper 200 may hold the semiconductor die 400P so that the semiconductor die 400P does not move and maintains a fixed position.

Figure 18:
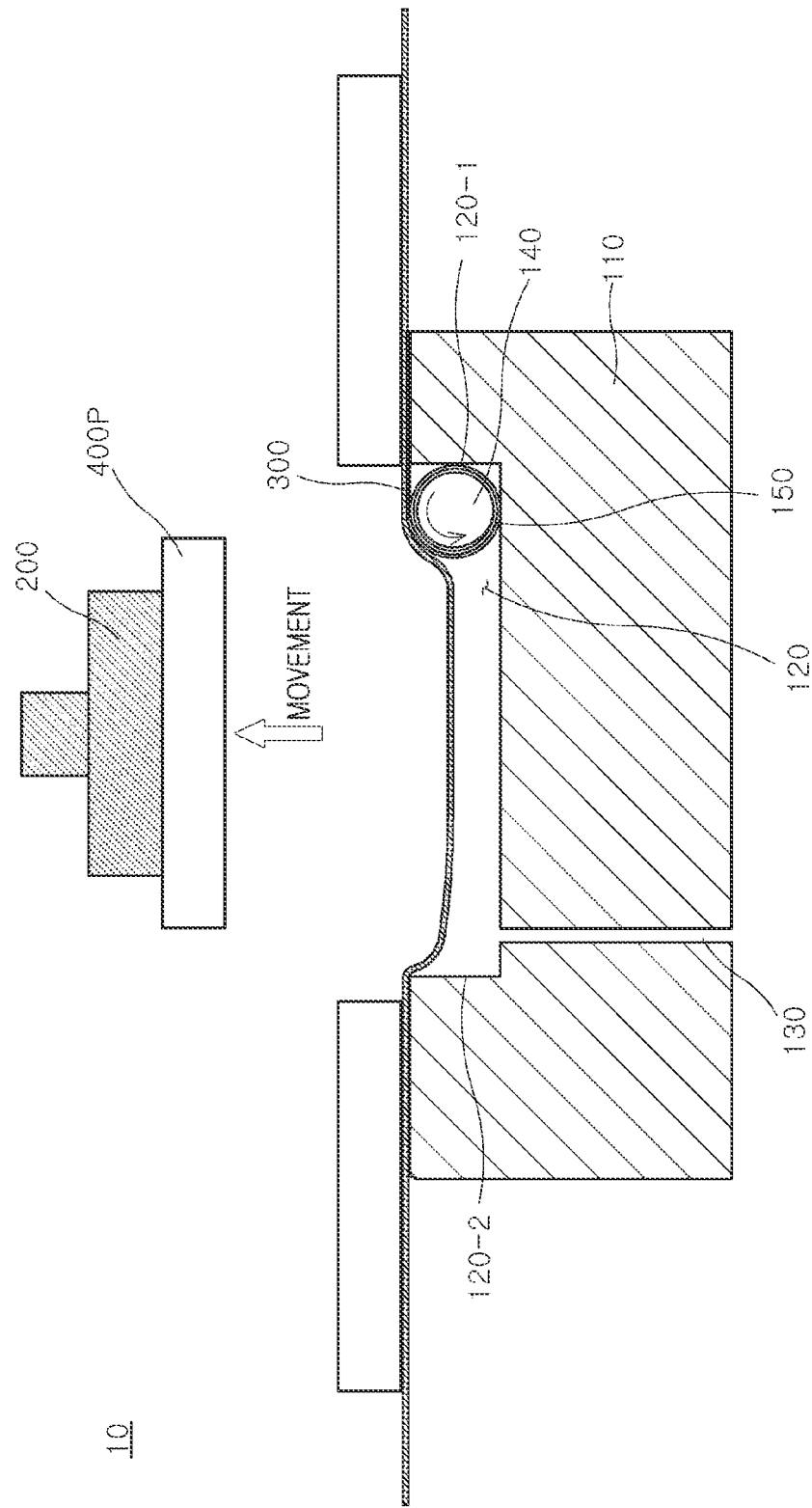

Referring to FIG. 18, the flipper 200 may hold and move the semiconductor die 400P that is separated from the mount tape 300. The vacuum suction that is maintained in the concave groove 120 of the housing part 110 may be stopped, and the roller part 140 may be moved toward the second side surface 120-2 of the concave groove 120 to close the concave groove 120 again. Thereafter, the process of separating the mount tape 300 from the semiconductor die may be repeatedly performed by moving the tape peeler 100 behind another semiconductor die.

Figure 19:
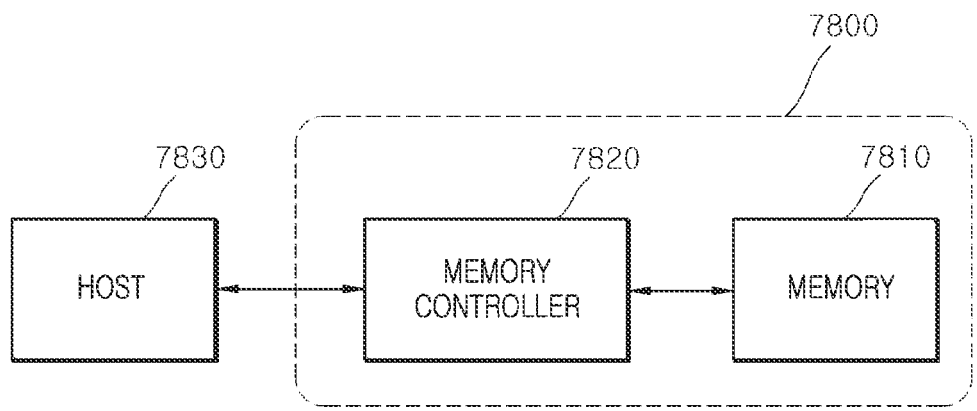
FIG. 19 is a block diagram illustrating an electronic system employing memory card including a semiconductor device in accordance with an embodiment.

FIG. 19 is a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 20:
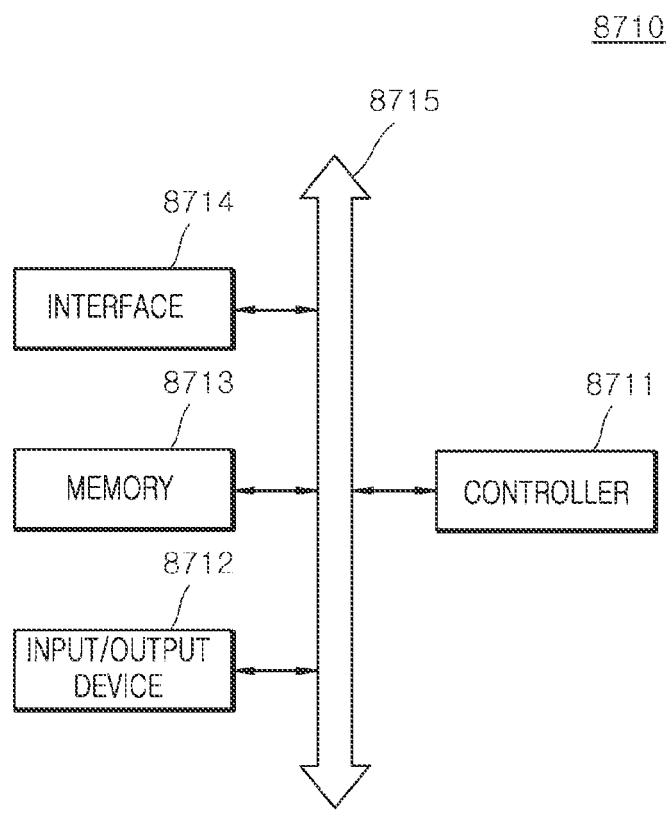
FIG. 20 is a block diagram illustrating an electronic system including a semiconductor device according to an embodiment.

FIG. 20 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 may be a device for storing data. The memory 8713 may store data and/or commands to be executed by the controller 8711, and the like.

The memory 8713 may include a volatile memory device, such as a DRAM and/or a nonvolatile memory device, such as a flash memory. For example, a flash memory may be mounted to an information processing system, such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system by using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or to Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor die pickup apparatus comprising:
    a tape peeler for peeling a mount tape from a semiconductor die; and
    a flipper for holding the semiconductor die,
    wherein the tape peeler includes:
        a housing part having a groove that faces the mount tape;
        a cover part covering the groove;
        a roller part connected to the cover part; and
        a vacuum part performing vacuum suction within the groove,
    wherein the roller part moves to wind the cover part,
    wherein the cover part includes a first end portion and a second end portion, the second end portion positioned on an opposite end in relation to the first end portion,
    wherein the first end portion of the cover part is connected to the housing part, and
    wherein the second end portion of the cover part is connected to the roller part.

2. The semiconductor die pickup apparatus of claim 1, wherein the roller part winds the cover part to sequentially open the groove.

3. The semiconductor die pickup apparatus of claim 1, wherein the roller part unwinds the cover part to sequentially close the groove.

4. The semiconductor die pickup apparatus of claim 1, wherein the housing part contacts the mount tape so that the semiconductor die overlaps with a region in the groove.

5. The semiconductor die pickup apparatus of claim 4, wherein the groove of the housing part has a width wider than a width of the semiconductor die.

6. The semiconductor die pickup apparatus of claim 1,
    wherein the groove of the housing part includes a first side surface and a second side surface, and
    wherein the roller part sequentially opens the groove by rolling from the second side surface to the first side surface of the groove in order to wind the cover part.

7. The semiconductor die pickup apparatus of claim 6,
    wherein the semiconductor die includes a first edge portion and a second edge portion, the second edge portion being on an opposite end in relation to the first edge portion,
    wherein the first edge portion of the semiconductor die is positioned closer to the second side surface of the groove than the first side surface of the groove, and
    wherein the second edge portion of the semiconductor die is positioned closer to the first side surface of the groove than the second side surface of the groove.

8. The semiconductor die pickup apparatus of claim 7,
    wherein the mount tape includes:
        a first portion adjacent to the first edge portion of the semiconductor die; and
        a second portion adjacent to the second edge portion of the semiconductor die,
    wherein the groove is sequentially opened due to the roller part, and
    wherein the roller part moves so that the cover part is separated from the first portion and the second portion of the mount tape.

9. The semiconductor die pickup apparatus of claim 8, wherein the first portion of the mount tape is peeled off earlier than the second portion due to the vacuum suction and the roller part, and
    wherein the first portion and the second portion of the mount tape are exposed in the groove.

10. The semiconductor die pickup apparatus of claim 1, wherein the vacuum part performs vacuum suction for a portion of the mount tape that is exposed to the vacuum suction based on the movement of the roller part so that the portion of the mount tape is peeled from the semiconductor die due to a pressure difference between the inside and the outside of the groove.

11. The semiconductor die pickup apparatus of claim 1, wherein the roller part moves toward the first end portion of the cover part while winding the cover part so that the groove of the housing part is sequentially opened from the second end portion of the cover part toward the first end potion of the cover part.

12. The semiconductor die pickup apparatus of claim 1, wherein the cover part includes a film made of a flexible material capable of being wound around the roller part while the roller part rotates in a first rotational direction.

13. The semiconductor die pickup apparatus of claim 12, wherein the cover part is released from the roller part and closes the groove of the housing part while the roller part rotates in a second rotational direction, a rotational direction that is opposite to the first rotational direction.

14. The semiconductor die pickup apparatus of claim 1, wherein the flipper holds the semiconductor die so that the semiconductor die maintains a fixed position, without moving, when the roller part winds.

15. The semiconductor die pickup apparatus of claim 14, wherein the flipper holds and fixes the semiconductor die through vacuum suction.

16. The semiconductor die pickup apparatus of claim 1, further comprising:
 a supporter for supporting the mount tape; and
 an expander for holding and expanding the mount tape.

\* \* \* \* \*